(12) United States Patent
Miki et al.

(10) Patent No.: US 9,178,073 B2
(45) Date of Patent: Nov. 3, 2015

(54) OXIDE FOR SEMICONDUCTOR LAYER OF THIN-FILM TRANSISTOR, SPUTTERING TARGET, AND THIN-FILM TRANSISTOR

(75) Inventors: Aya Miki, Kobe (JP); Shinya Morita, Kobe (JP); Toshihiro Kugimiya, Kobe (JP); Satoshi Yasuno, Kobe (JP); Jae Woo Park, Seongnam (KR); Je Hun Lee, Seoul (KR); Byung Du Ahn, Hwaseong (KR); Gun Hee Kim, Hwaseong (KR)

(73) Assignees: Kobe Steel, Ltd., Kobe-shi (JP); Samsung Display Co., Ltd., Yongin (KR)

(*) Notice: Subject to any disclaimer, the term of this patent is extended or adjusted under 35 U.S.C. 154(b) by 0 days.

(21) Appl. No.: 13/989,944

(22) PCT Filed: Nov. 28, 2011

(86) PCT No.: PCT/JP2011/077304
§ 371 (c)(1), (2), (4) Date: May 28, 2013

(87) PCT Pub. No.: WO2012/070675
PCT Pub. Date: May 31, 2012

(65) Prior Publication Data
US 2013/0248855 A1    Sep. 26, 2013

(30) Foreign Application Priority Data

Nov. 26, 2010  (JP) ................... 2010-264324
Jan. 18, 2011  (JP) ................... 2011-008325

(51) Int. Cl.
*H01L 29/786* (2006.01)
*C01G 19/00* (2006.01)
(Continued)

(52) U.S. Cl.
CPC .......... *H01L 29/7869* (2013.01); *C01G 19/006* (2013.01); *C04B 35/01* (2013.01);
(Continued)

(58) Field of Classification Search
CPC ............... H01L 29/7869; H01L 29/78693; H01L 27/1225; H01L 21/02565
USPC .............................. 257/43; 438/104
See application file for complete search history.

(56) References Cited

U.S. PATENT DOCUMENTS 8,212,248 B2  7/2012  Itagaki et al.
8,232,552 B2  7/2012  Yano et al.
(Continued)

FOREIGN PATENT DOCUMENTS

CN  101268026  9/2008
CN  101669208  3/2010
(Continued)

OTHER PUBLICATIONS

Nomura, K., et al., "Amorphous Oxide Semiconductors for High-Performance Flexible Thin-Film Transistors", Solid physics, vol. 44, P621, (2009) equivalent Japanese article (Japanese Journal of Applied Physics, vol. 45, No. 5B, 2006, pp. 4303-4308) English translation.
(Continued)

*Primary Examiner* — Matthew Landau
*Assistant Examiner* — Eric Ward
(74) *Attorney, Agent, or Firm* — Oblon, McClelland, Maier & Neustadt, L.L.P.

(57) ABSTRACT

This oxide for a semiconductor layer of a thin-film transistor contains Zn, Sn and In, and the content (at %) of the metal elements contained in the oxide satisfies formulas (1) to (3) when denoted as [Zn], [Sn] and [In], respectively. $[In]/([In]+[Zn]+[Sn]) \geq -0.53 \times [Zn]/([Zn]+[Sn])+0.36$ (1) $[In]/([In]+[Zn]+[Sn]) \geq 2.28 \times [Zn]/([Zn]+[Sn])-2.01$ (2) $[In]/([In]+[Zn]+[Sn]) \leq 1.1 \times [Zn]/([Zn]+[Sn])-0.32$ (3) The present invention enables a thin-film transistor oxide that achieves high mobility and has excellent stress resistance (negligible threshold voltage shift before and after applying stress) to be provided.

3 Claims, 2 Drawing Sheets

(51) Int. Cl.
*C23C 14/08* (2006.01)
*C23C 14/34* (2006.01)
*H01L 21/02* (2006.01)
*C04B 35/453* (2006.01)
*C23C 14/54* (2006.01)
*C23C 14/58* (2006.01)
*C04B 35/01* (2006.01)
*C04B 35/457* (2006.01)
*H01L 27/12* (2006.01)

(52) U.S. Cl.
CPC ............ *C04B 35/453* (2013.01); *C04B 35/457* (2013.01); *C23C 14/086* (2013.01); *C23C 14/3407* (2013.01); *C23C 14/548* (2013.01); *C23C 14/5806* (2013.01); *C23C 14/5873* (2013.01); *H01L 21/02554* (2013.01); *H01L 21/02565* (2013.01); *H01L 21/02631* (2013.01); *C01P 2006/10* (2013.01); *C04B 2235/3284* (2013.01); *C04B 2235/3286* (2013.01); *C04B 2235/3293* (2013.01); *H01L 27/1225* (2013.01); *H01L 29/78693* (2013.01)

(56) References Cited

U.S. PATENT DOCUMENTS

| | | | | |
|---|---|---|---|---|
| 8,753,548 | B2* | 6/2014 | Yano et al. | 252/519.51 |
| 2007/0194379 | A1 | 8/2007 | Hosono et al. | |
| 2009/0189153 | A1* | 7/2009 | Iwasaki et al. | 257/43 |
| 2009/0278122 | A1 | 11/2009 | Hosono et al. | |
| 2009/0280600 | A1 | 11/2009 | Hosono et al. | |
| 2010/0044703 | A1* | 2/2010 | Yabuta et al. | 257/43 |
| 2010/0155717 | A1* | 6/2010 | Yano et al. | 257/43 |
| 2010/0266787 | A1* | 10/2010 | Yano et al. | 428/1.1 |
| 2011/0101352 | A1 | 5/2011 | Hosono et al. | |
| 2011/0201162 | A1 | 8/2011 | Hosono et al. | |
| 2011/0260121 | A1 | 10/2011 | Yano et al. | |
| 2012/0012838 | A1 | 1/2012 | Hosono et al. | |
| 2013/0112971 | A1 | 5/2013 | Yano et al. | |

FOREIGN PATENT DOCUMENTS

| | | | |
|---|---|---|---|
| CN | 102245531 | 11/2011 | |
| JP | 2008 243928 | 10/2008 | |
| JP | 2009 164393 | 7/2009 | |
| JP | 2010-030824 A | 2/2010 | |
| JP | 2010 70410 | 4/2010 | |
| KR | 10-2007-0116888 A | 12/2007 | |
| WO | WO 2005/088726 A1 | 9/2005 | |
| WO | WO 2010/023889 A1 | 3/2010 | |
| WO | WO 2010/067571 A1 * | 6/2010 | ............ C23C 14/34 |

OTHER PUBLICATIONS

Nomura, K. et al., "Room-temperature fabrication of transparent flexible thin-film transistors using amorphous oxide semiconductors", Nature, vol. 432, pp. 488 to 492, (Nov. 25, 2004).
International Search Report Issued Feb. 7, 2012 in PCT/JP11/77304 Filed Nov. 28, 2011.
U.S. Appl. No. 14/399,378, filed Nov. 6, 2014, Goto, et al.

* cited by examiner

OXIDE FOR SEMICONDUCTOR LAYER OF THIN-FILM TRANSISTOR, SPUTTERING TARGET, AND THIN-FILM TRANSISTOR

TECHNICAL FIELD

The present invention relates to an oxide for a semiconductor layer of a thin-film transistor to be used display devices such as a liquid crystal display, an organic EL display; a sputtering target for forming a film of the oxide; and a thin-film transistor.

BACKGROUND ART

As compared with widely used amorphous silicon (a-Si), an amorphous (noncrystalline) oxide semiconductor has high carrier mobility, a high optical band gap, and film formability at low temperature and, therefore, has been highly expected to be applied for next generation displays which are required to have a large size, high resolution, and high-speed drive, resin substrates which has low heat resistance, and the like.

Of oxide semiconductors, an amorphous oxide semiconductor containing indium, gallium, zinc, and oxygen (In—Ga—Zn—O, hereinafter also referred to as "IGZO"), which has a considerably high carrier mobility, is particularly preferably used. For example, Non-Patent Documents 1 and 2 disclose a thin-film transistor (TFT) including a thin oxide semiconductor film of In:Ga:Zn=1.1:1.1:0.9 (atomic % ratio) as a semiconductor layer (active layer). Patent Document 1 also discloses an amorphous oxide containing elements, such as In, Zn, Sn, Ga, and the like, and Mo, where Mo has an atomic composition ratio of 0.1 to 5 atomic % with respect to the total number of metal atoms in the amorphous oxide. A TFT including an active layer of IGZO doped with Mo is disclosed in the example of Patent Document 1.

PRIOR ART DOCUMENT

Patent Document

Patent Document 1: JP-A-2009-164393

Non-Patent Document

Non-patent Document 1: solid physics, vol44, P621 (2009)
Non-patent Document 2: Nature, vol432, P488 (2004)

SUMMARY OF THE INVENTION

Problems to be Solved by the Invention

In the case where an oxide semiconductor is used as a semiconductor layer for a thin-film transistor, the oxide semiconductor is required not only to have a high carrier concentration but also to be excellent in switching properties (transistor characteristics) of TFT. Specifically, the oxide semiconductor is required to satisfy (1) high ON-current (maximum drain current when positive voltage is applied to a gate electrode and a drain electrode); (2) low OFF-current (drain current when negative voltage is applied to a gate electrode and positive voltage is applied to a drain electrode); (3) low SS value (Subthreshold Swing, gate voltage required to increase drain current by one digit); (4) stability of threshold with the lapse of time (voltage at which drain current starts flowing when positive voltage is applied to a drain electrode and either positive or negative voltage is applied to a gate voltage, which is also referred to as threshold voltage) (it means uniform even in in-place of substrate); (5) a high mobility; (6) a small change in above mentioned properties at the time of light irradiation, and the like. The inventors of the present invention have investigated the above properties of ZTO containing Mo semiconductor described in previously mentioned Patent Document 1. As a result, they have found that it showed degradation of ON-current and elevation of SS value compared with that of ZTO.

Furthermore, a TFT using an oxide semiconductor layer of IGZO and ZTO, and the like are required to be excellent in resistance (stress stability) to voltage application and stress of light irradiation, and the like. For example, when positive voltage or negative voltage is continuously applied to gate voltage or when light in a blue emitting band in which light absorption starts is continuously irradiated, the threshold voltage is changed (shifted) considerably, and it is pointed out that because of that, the switching properties of the TFT are changed. And for example, at the time of driving a liquid crystal panel or at the time of lighting a pixel by applying negative bias to a gate electrode, and the like, the TFT is irradiated with light leaked out from a liquid crystal cell and this light gives stress to the TFT to cause deterioration of the properties such as elevation of the OFF-current, shift of the threshold voltage, and increase of the SS value, and the like. Particularly, shift of the threshold voltage leads to lowering of reliability in a display device itself such as a liquid crystal display or an organic EL display equipped with TFT, and, therefore, it has been desired to improve the stress stability (small change before and after stress tests).

The present invention has been made in view of the above situation. It is an object of the present invention to provide an oxide for a thin-film transistor, which has a high mobility and excellent stress stability (a small threshold voltage shift between before and after stress tests), a thin-film transistor including the oxide, and a sputtering target for use in forming the oxide.

Means for Solving the Problems

An oxide for semiconductor layer of a thin-film transistor of the present invention which can be solved above problems is a oxide to be used for the semiconductor layer of the transistor, wherein the oxide contains Zn, Sn and In, and in the case where the content (atomic %) of metal elements contained in the oxide is defined as [Zn], [Sn], and [In] respectively, the content satisfies below expressions (1) to (3).

$$[In]/([In]+[Zn]+[Sn]) \geq -0.53 \times [Zn]/([Zn]+[Sn])+0.36 \quad (1)$$

$$[In]/([In]+[Zn]+[Sn]) \geq 2.28 \times [Zn]/([Zn]+[Sn])-2.01 \quad (2)$$

$$[In]/([In]+[Zn]+[Sn]) \leq 1.1 \times [Zn]/([Zn]+[Sn])-0.32 \quad (3)$$

The above oxide preferably satisfies below expression (6)

$$[In]/([In]+[Zn]+[Sn]) \geq 0.05 \quad (6)$$

A thin-film transistor having the above oxide as a semiconductor layer of the thin-film transistor is included in the present invention.

The density of the above semiconductor layer is preferably 5.8 g/cm³ or higher.

Also, a sputtering target of the present invention is a sputtering target for forming the above oxide, wherein in the case where the content (atomic %) of metal elements contained in the sputtering target is defined as [Zn], [Sn] and [In] respectively, the content satisfies below expressions (1) to (3).

$$[In]/([In]+[Zn]+[Sn]) \geq -0.53 \times [Zn]/([Zn]+[Sn])+0.36 \quad (1)$$

$$[In]/([In]+[Zn]+[Sn]) \geq 2.28 \times [Zn]/([Zn]+[Sn])-2.01 \quad (2)$$

$$[In]/([In]+[Zn]+[Sn]) \leq 1.1 \times [Zn]/([Zn]+[Sn])-0.32 \quad (3)$$

The above sputtering target preferably satisfies below expression (6)

$$[In]/([In]+[Zn]+[Sn]) \geq 0.05 \quad (6)$$

Effects of the Invention

With the oxide of the present invention, a thin-film transistor having a high mobility and excellent stress stability (a smaller threshold voltage shift between before and after stress tests) can be provided. As a result, a display device, which includes the thin-film transistor, has a greatly improved level of reliability against light irradiation.

MODE FOR CARRYING OUT THE INVENTION

Figure 1:
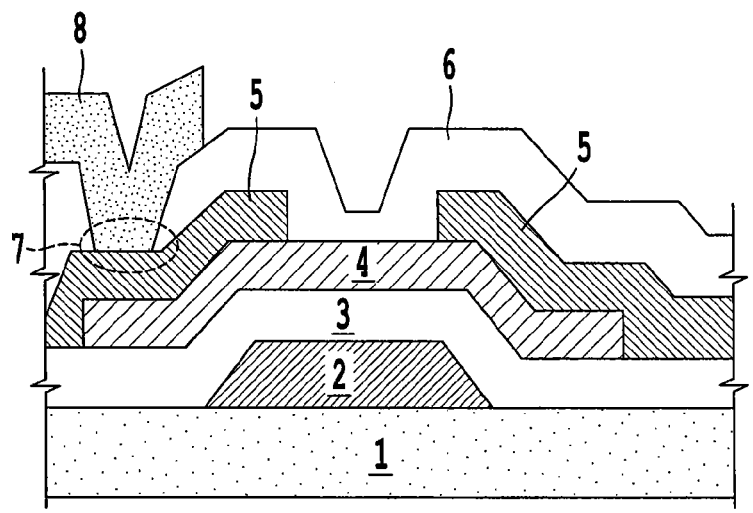
FIG. 1 is a schematic cross-sectional view for illustrating a thin-film transistor of the present invention having a present inventive oxide semiconductor.

The present inventors have extensively studied an oxide containing Zn, Sn, and In (hereinafter also represented by "IZTO") in order to improve TFT characteristics and stress stability of a TFT including an active layer (semiconductor layer) which is formed of that oxide. As a result, the present inventors have found that the desired object is achieved by using, as a semiconductor layer of a TFT, an IZTO whose composition ratio of the metal elements is appropriately controlled. The present invention has been made based on this finding. The oxide of the present invention allows for a TFT having excellent TFT characteristics (specifically, a high mobility, a high ON-current, a low SS value, and a small absolute value of a threshold voltage (Vth) in the vicinity of 0V) and a small change in transistor characteristics between before and after stress tests (specifically, a smaller change rate (ΔVth) of Vth after stress tests (light irradiation and negative bias)).

Specifically, the present inventors have conducted numerous preliminary experiments on the influence of In, Zn, and Sn on the TFT characteristics and the stress stability to find the followings: (a) although In contributes to an improvement in the mobility, a large amount of In added leads to a decrease in the stability (resistance) against light stress or is likely to make the TFT conductive; (b) although Zn improves the stability against light stress, a large amount of Zn added leads to a sharp decrease in the mobility or a decrease in the TFT characteristics or the stress stability; and (c) although, similar to Zn, Sn effectively improves the stability against light stress, and the addition of Sn hinders or prevents the IZTO from becoming conductive, a large amount of Sn added leads to a decrease in the mobility or a decrease in the TFT characteristics or the stress stability.

Based on these findings, the present inventors have further studied and found the following. That is, in the case where the content (atomic %) of metal elements contained in an oxide is defied as [Zn], [Sn], and [In] respectively, the ratio of [In] represented by [In]/([In]+[Zn]+[Sn]) (hereinafter also simply abbreviated to "In ratio") in relation to the ratio of [Zn] represented by [Zn]/([Zn]+[Sn]) (hereinafter also simply abbreviated to "Zn ratio") satisfies all expressions (1) to (3) below, the oxide has satisfactory characteristics. The present invention has been made based on the finding.

$$[In]/([In]+[Zn]+[Sn]) \geq -0.53 \times [Zn]/([Zn]+[Sn])+0.36 \quad (1)$$

$$[In]/([In]+[Zn]+[Sn]) \geq 2.28 \times [Zn]/([Zn]+[Sn])-2.01 \quad (2)$$

$$[In]/([In]+[Zn]+[Sn]) \leq 1.1 \times [Zn]/([Zn]+[Sn])-0.32 \quad (3)$$

Figure 2:
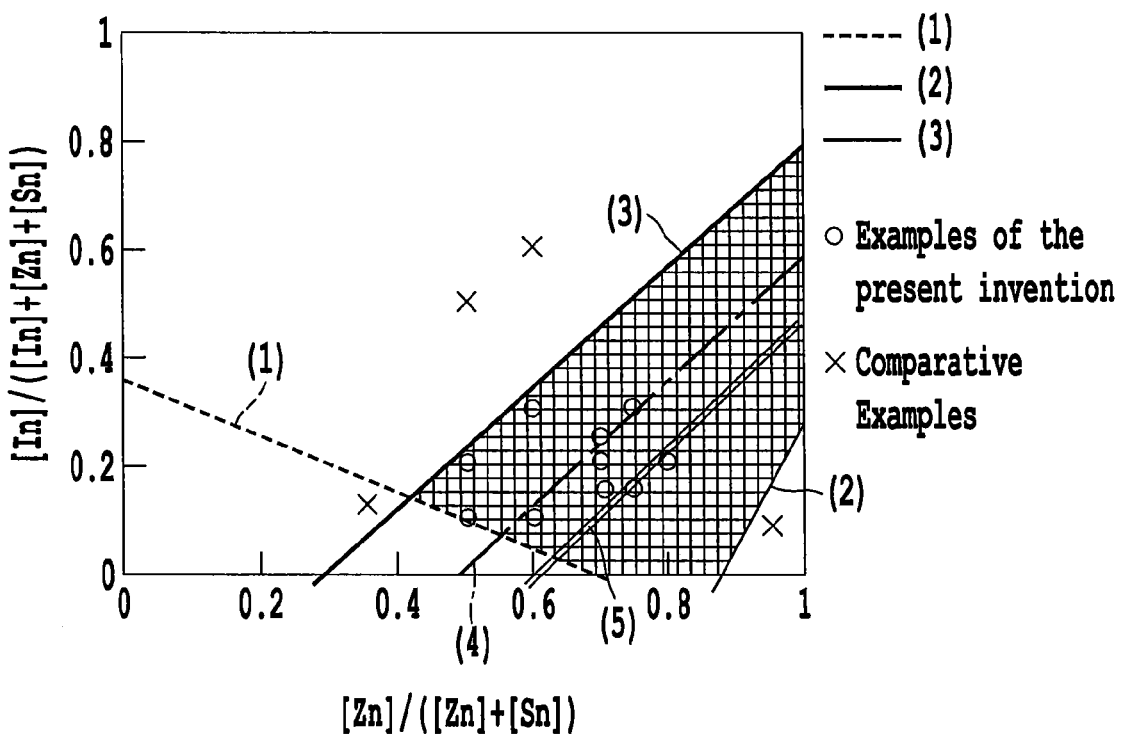
FIG. 2 is a graph showing a region, which satisfies a range of expressions (1) to (3) defined in the present invention.

FIG. 2 shows regions of above expressions (1) to (3). A hatched portion of FIG. 2 indicates a region in which all expressions (1) to (3) above are satisfied. In FIG. 2, characteristics results of examples described below are also plotted. Some results that fall within the hatched range of FIG. 2 are satisfactory in terms of all of saturated mobility, TFT characteristics, and stress stability (circles in FIG. 2), while the other results that do not fall within the hatched portion of FIG. 2 (i.e., the results do not satisfy all of above expressions (1) to (3)) have at least one of the above properties that is reduced (crosses in FIG. 2).

Of above expressions (1) to (3), expressions (1) and (2), which mainly relate to the mobility, have been prepared based on numerous preliminary experiments to define the In ratio for achieving a high mobility in association with the Zn ratio.

Expression (3), which mainly relates to an improvement in the stress stability and the TFT characteristics (TFT stability), has been prepared based on numerous preliminary experiments to define the In ratio for achieving high light stress stability in association with the Zn ratio.

Specifically, it has been found that most of the results which do not satisfy all of expressions (1) to (3) have drawbacks described below.

Firstly, IZTOs which satisfy expression (2) and do not satisfy expressions (1) and (3) have larger Sn ratios (i.e., smaller Zn ratios). Therefore, for such IZTOs, although the mobility tends to increase, the S value or the Vth value tends to increase, and therefore, the TFT characteristics and the stress stability tend to decrease. Therefore, the desired characteristics are not obtained (see, for example, No. 13 in the examples below).

Also, IZTOs which satisfy expressions (1) and (3) and do not satisfy expression (2) have larger Zn ratios (i.e., smaller Sn ratios). Therefore, for such IZTOs, the mobility tends to sharply decrease, and the S value or the Vth value tends to significantly increase, and therefore, the TFT characteristics and the stress stability tend to decrease. Therefore, the desired characteristics are not obtained (see, for example, No. 14 in the examples below).

On the other hand, for IZTOs which satisfy expressions (1) and (2) and do not satisfy expression (3) and which have larger In ratios, the mobility tends to increase, and the stress stability tends to decrease. Therefore, the desired characteristics are not obtained (see, for example, Nos. 9 and 10 in the examples below).

The oxide for the TFT semiconductor layer according to the present invention satisfies the above requirements. Furthermore, the ratio of [In] to ([Zn]+[Sn]+[In]) is preferably 0.05 or higher. Specifically, the ratio of [In] preferably satisfies following expression (6):

$$[In]/([In]+[Zn]+[Sn]) \geq 0.05 \quad (6)$$

As described above, In is an element that increases the mobility. When the ratio of [In] represented by expression (6) is less than 0.05, the above effect is not effectively exhibited. More preferably, the In ratio is 0.1 or higher. On the other hand, if the In ratio is excessively high, the stress stability decreases or the oxide is likely to become conductive. Therefore, mostly, the In ratio is preferably 0.5 or less.

The oxide of the present invention is described above.

The above oxide is preferably formed in a film using a sputtering target (which may be hereinafter referred to as a "target") with a sputtering method. The oxide can be formed by a chemical film formation method such as a coating method; however, it is possible to easily form a thin film excellent in film in-plane uniformity of components and film thickness according to the sputtering method.

As a target to be used in the sputtering method, there may preferably be used a target containing the elements described above and having the same composition as that of a desired oxide, thereby making it possible to form a thin film having a desired component composition without a possibility of a composition gap. More specifically, the content (atomic %) of metal elements contained in the sputtering target defined as [Zn], [Sn] and [In] respectively satisfies following expressions (1) to (3):

$$[In]/([In]+[Zn]+[Sn]) \geq -0.53 \times [Zn]/([Zn]+[Sn])+0.36 \quad (1)$$

$$[In]/([In]+[Zn]+[Sn]) \geq 2.28 \times [Zn]/([Zn]+[Sn])-2.01 \quad (2)$$

$$[In]/([In]+[Zn]+[Sn]) \leq 1.1 \times [Zn]/([Zn]+[Sn])-0.32 \quad (3)$$

Above sputtering target preferably satisfies following expression (6):

$$[In]/([In]+[Zn]+[Sn]) \geq 0.05 \quad (6)$$

Alternatively, film formation may be carried out by a co-sputtering method for simultaneously discharging two targets with different compositions and consequently, a film with a desired composition can be obtained by co-sputtering targets such as $In_2O_3$, $ZnO$, $SnO_2$, and the like or a target of mixture thereof.

The above-mentioned targets can be produced by, for example, a powder sintering process method.

In the case of sputtering the above-mentioned target, it is preferable that the substrate temperature is adjusted to room temperature and the concentration of oxygen is controlled properly for the execution. The concentration of oxygen may be controlled properly in accordance with the configuration of a sputtering apparatus and the target composition, and the like, and it is preferable to add oxygen in such a manner that the carrier concentration of the oxide semiconductor is approximately $10^{15}$ to $10^{16}$ cm$^{-3}$. The concentration of oxygen in examples of the invention is controlled such that it satisfies $O_2/(Ar+O_2)=2\%$ in addition flow ratio.

Also, in the case where the above-mentioned oxide is used as the semiconductor layer of the TFT, the density of the oxide semiconductor layer is preferably 5.8 g/cm$^3$ or higher (described below), and in order to form a film of such an oxide, it is preferable to properly control the gas pressure during sputtering, the power input to a sputtering target, the substrate temperature, and the like. For example, if the gas pressure is made low at the time of film formation, scattering of sputtered atoms one another can be prevented and it is supposed to be possible to form a compact (highly dense) film, and due to that, it is good as the entire gas pressure at the time of film formation is low to an extent that the discharge for sputtering is stabilized, and the pressure may be controlled preferably in a range of approximately 0.5 to 5 mTorr and more preferably in a range of 1 to 3 mTorr. Also, it is good as the power input is high, and it is recommended to set the power input of DC or RF to approximately 2.0 W/cm$^2$ or higher. It is also good as the substrate temperature at the time of film formation is high, and it is recommended to set the temperature to a range around room temperature to 200° C.

The film thickness of the oxide formed into a film as described above is preferably 30 nm or more and 200 nm or less, and more preferably 35 nm or more and 80 nm or less.

The present invention also encompasses a TFT having the above-mentioned oxide as a semiconductor layer of the TFT. The TFT may have at least a gate electrode, a gate insulator layer, a semiconductor layer of the above-mentioned oxide, a source electrode, and a drain electrode on a substrate, and its configuration is not particularly limited as long as it is used commonly.

Herein, the density of the above oxide semiconductor layer is preferably 5.8 g/cm$^3$ or higher. If the density of the oxide semiconductor layer is high, defects in the film are decreased to improve the film quality, and also since the interatomic distance is narrowed, the electron field-effect mobility of a TFT element is significantly increased and the electric conductivity becomes high and the stability to stress by light irradiation is improved. The density of the above oxide semiconductor layer is good as it is higher, and it is more preferably 5.9 g/cm$^3$ or more and further preferably 6.0 g/cm$^3$ or more. The density of the oxide semiconductor layer is measured by a method described in examples below.

As shown in the examples below, as the density of the oxide semiconductor layer increases, the amount of a threshold voltage change (ΔVth) after the stress test (light irradiation and negative bias application) tends to decrease, so that the stability against stress and the reliability of the display device are improved. In other words, as the density of the oxide semiconductor layer increases, the region with satisfactory stability against stress increases. Therefore, the composition of the oxide semiconductor layer which is preferable in order to obtain a preferable ΔVth may vary depending on the density of the oxide semiconductor layer.

Specifically, ΔVth after the stress test, which was measured by a technique described in the examples below, is evaluated and classified as follows: "satisfactory (circles)" when the absolute value of ΔVth is 15 V or less; specifically, "more satisfactory (double circles)" when the absolute value of ΔVth is 10 V or less; and more specifically, "even more satisfactory (stars)" when the absolute value of ΔVth is 6 V or less. In this case, composition ranges of the oxide semiconductor layer which are preferable in order to obtain the above regions (indicated by circles, double circles, and stars) and depend on the density of the oxide semiconductor layer, can be represented by expressions described below (below expressions (3) to (5)). The regions represented by expressions (4) and (5) below are also shown in FIG. 2.

As can be seen from FIG. 2, the lines of expressions (3) to (5) have the same slope and different intercepts. The acceptable range of the ratio of [In] is strictly limited in ascending order of expression No. (i.e., (3)→(4)→(5)).

(a) When the density of the oxide semiconductor layer is 5.8 g/cm$^3$ or higher and smaller than 5.9 g/cm$^3$:

in order to obtain the composition of the oxide semiconductor layer whose ΔVth has an absolute value of 15 V or less ("circle"), it is preferable to satisfy expression (3); in order to obtain the composition of the oxide semiconductor layer whose ΔVth has an absolute value of 10 V or less ("double circle"), it is insufficient to only satisfy expression (3), and it is preferable to satisfy expression (4); and in order to obtain the composition of the oxide semiconductor layer whose ΔVth has an absolute value of 6 V or less ("star"), it is insufficient to only satisfy expression (4), and it is preferable to satisfy expression (5).

$$[In]/([In]+[Zn]+[Sn]) \leq 1.1 \times [Zn]/([Zn]+[Sn])-0.32 \quad (3)$$

$$[In]/([In]+[Zn]+[Sn]) \leq 1.1 \times [Zn]/([Zn]+[Sn])-0.52 \quad (4)$$

$$[In]/([In]+[Zn]+[Sn]) \leq 1.1 \times [Zn]/([Zn]+[Sn])-0.68 \quad (5)$$

For example, Nos. 6 and 9 in Table 2 described below indicate the oxide semiconductor layers having a density of 5.8 g/cm$^3$ which satisfy expression (3), and therefore, have an absolute value of ΔVth of 13.4 V (No. 6) and 10.3 V (No. 9), which meet the pass criterion for "circle." In contrast to this, No. 3 in Table 2 indicates the oxide semiconductor layer having a density of 5.8 g/cm$^3$ which satisfy not only expression (3) but also expression (4), and therefore, has an absolute value of ΔVth of 7.4 V, which meets the pass criterion for "double circle."

(b) When the density of the oxide semiconductor layer is 5.9 g/cm$^3$ or higher and smaller than 6.0 g/cm$^3$:

In order to obtain the composition of the oxide semiconductor layer whose ΔVth has an absolute value of 15 V or less ("circle") or 10 V or less ("double circle"), it is in both cases preferable to satisfy expression (3); and in order to obtain the composition of the oxide semiconductor layer whose ΔVth has an absolute value of 6 V or less ("star"), it is preferable to satisfy expression (4). Specifically, when the density of the oxide semiconductor layer is higher than that of (a), the composition range (acceptable range) of the oxide semiconductor layer which is preferable in order to obtain the same ΔVth (evaluation reference) becomes wider, and therefore, even if expression (5) is not satisfied, then when expression (4) is only satisfied, an absolute value of ΔVth of 6 V or less ("star") is obtained.

For example, No. 5 in Table 2 below indicates the oxide semiconductor layer having a density of 5.9 g/cm$^3$ which satisfies expression (3), and therefore, has an absolute value of ΔVth of 10.7, which meets the pass criterion for "circle." Similarly, No. 8 in Table 2 indicates the oxide semiconductor layer having a density of 5.9 g/cm$^3$ which satisfies not only expression (3) but also expression (4), and therefore, has an absolute value of ΔVth of 6.9 V, which meets the pass criterion for "double circle."

(c) When the density of the oxide semiconductor layer is 6.0 g/cm$^3$ or higher:

in order to obtain the composition of the oxide semiconductor layer whose ΔVth has an absolute value of 15 V or less ("circle"), 10 V or less ("double circle"), or 6 V or less ("star"), it is in all cases preferable to satisfy expression (3). Specifically, when the density of the oxide semiconductor layer is higher than that of (b), the composition range (acceptable range) of the oxide semiconductor layer which is preferable in order to obtain the same ΔVth (evaluation reference) becomes wider, and therefore, even if expression (4) is not satisfied, then when expression (3) is only satisfied, an absolute value of ΔVth of 6 V or less ("star") is obtained.

For example, Nos. 1, 4, and 7 in Table 2 below indicate the oxide semiconductor layers having a density of 6.2 g/cm$^3$ which satisfy expression (3), and therefore, have an absolute value of ΔVth of 1.3 V (No. 1), 6.0 V (No. 4), and 4.2 V (No. 7), which meet the pass criterion for "star."

Hereinafter, by referring to FIG. 1, embodiments of a method for producing the above-mentioned TFT will be described. FIG. 1 and the following production method describe one example of preferred embodiments of the present invention, and it is not intended that the present invention be limited thereto. For example, FIG. 1 shows a TFT with a bottom gate type structure, however, the TFT is not limited thereto, and the TFT may be a top gate type TFT having a gate insulator layer and a gate electrode successively on an oxide semiconductor layer.

As shown in FIG. 1, a gate electrode 2 and a gate insulator layer 3 are formed on a substrate 1 and an oxide semiconductor layer 4 is formed further thereon. A source-drain electrode 5 is formed on the oxide semiconductor layer 4 and a passivation layer (insulator layer) 6 is formed thereon and a transparent conductive film 8 is electrically connected to the drain electrode 5 through a contact hole 7.

A method for forming the gate electrode 2 and the gate insulator layer 3 on the substrate 1 is not particularly limited and methods commonly used can be adopted. Also, the kinds of the gate electrode, and the gate insulator layer 3 are not also particularly limited and widely used ones can be used. For example, metals such as Al and Cu with low electric resistance and their alloys can be preferably used for the gate electrode. Also, typical examples of the gate insulator layer include a silicon oxide film, a silicon nitride film, and a silicon oxynitride film, and the like. Additionally, metal oxides such as $TiO_2$, $Al_2O_3$ and $Y_2O_3$ and those formed by layering them can be also used.

Next, the oxide semiconductor layer 4 is formed. The oxide semiconductor layer 4 is preferable to be formed into a film by, as described above, a DC sputtering method or an RF sputtering method using a sputtering target with the same composition as that of the thin film. Alternatively, the film formation may be carried out by a co-sputtering method.

After wet etching, the oxide semiconductor layer 4 is subjected to patterning. It is preferable to carry out heat treatment (pre-annealing) for improving the film quality of the oxide semiconductor layer 4 immediately after the patterning and accordingly, the ON-current and electron field-effect mobility, which are transistor characteristics, are increased and the transistor performance is improved. The preferable pre-annealing condition is, for example, temperature: about 250 to 350° C., time: about 15 to 120 minutes.

After pre-annealing, the source-drain electrode 5 is formed. The kind of the source-drain electrode 5 is not particularly limited and widely used ones can be used. For example, similarly to the gate electrode, metals such as Al and Cu and their alloys may be used, or pure Ti as described in examples below may be used, or further laminated structure of metals and the like may be used.

A method for forming the source-drain electrode 5 may be carried out by, for example, forming a metal thin film by a magnetron sputtering method and forming the metal thin film into the source-drain electrode 5 by a lift-off method. Alternatively, there is a method for forming the source-drain electrode 5 by previously forming a prescribed metal thin film by a sputtering method and thereafter forming the electrode by patterning, not forming the electrode by the lift-off method as described above; however, this method deteriorates the transistor characteristics since the oxide semiconductor layer is damaged at the time of etching of the electrode. Therefore, in order to avoid such problems, a method including previously forming a passivation layer on the oxide semiconductor layer, and subsequently forming the electrode by patterning is adopted, and this method is used in examples described below.

Next, the passivation layer (insulator layer) 6 is formed on the oxide semiconductor layer 4 by a CVD (Chemical Vapor Deposition) method. The surface of the oxide semiconductor layer 4 is converted easily to be conductive by plasma-induced damage due to CVD (it is supposedly attributed to that oxygen deficiency formed on the surface of the oxide semiconductor becomes an electron donor), and in order to avoid the problems, $N_2O$ plasma irradiation is carried out before film formation of the passivation layer in examples described below. The condition described in the following document is adopted as the $N_2O$ plasma irradiation condition.

J. Park, et. al, Appl. Phys. Lett., 93, 053505 (2008).

Next, according to a common method, the transparent conductive film 8 is electrically connected to the drain electrode 5 through the contact hole 7. The kinds of the transparent conductive film and drain electrode are not particularly limited, and those which are used commonly can be used. As the drain electrode, materials exemplified for the above-mentioned source-drain electrodes can be used.

EXAMPLES

Below, by way of examples, the present invention will be more specifically described. However, the present invention is not limited by the following examples. It is naturally understood that modifications may be properly made and practiced within the scope adaptable to the meaning described above and below. All of these are included in the technical scope of the present invention.

Example 1

According to the above-mentioned method, a thin-film transistor (TFT) shown in FIG. 1 was produced and the TFT characteristics and the stress stability were evaluated.

First, a Ti thin film with a thickness of 100 nm as a gate electrode and a gate insulator layer $SiO_2$ (200 nm) were successively formed on a glass substrate (EAGLE 2000 manufactured by Corning Incorporated, diameter 100 mm×thickness 0.7 mm). The gate electrode was formed by using a pure Ti sputtering target by a DC sputtering method in conditions as follows: film formation temperature: room temperature, film formation power: 300 W, carrier gas: Ar, and gas pressure: 2 mTorr. Also, the gate insulator layer was formed by a plasma CVD method in conditions as follows: carrier gas: mixed gas of $SiH_4$ and $N_2O$, film formation power: 100 W, and film formation temperature: 300° C.

Next, oxide (IZTO) thin films with various compositions as described in Table 1 were formed by a sputtering method using sputtering targets (described below). For comparison, ZTO (conventional example) containing no In was also formed. An apparatus used for the sputtering was "CS-200" manufactured by ULVAC, Inc. and the sputtering conditions were as follows.
 Substrate temperature: room temperature
 Gas pressure: 5 mTorr
 Oxygen partial pressure: $O_2/(Ar+O_2)$=2%
 Film thickness: 50 nm
 Size of target used: φ4 inch×5 mm
 Input power (DC): 2.55 W/cm$^2$ The IZTO films having different compositions were formed by RF sputtering method using two sputtering targets having different compositions (a sputtering target of $In_2O_3$ and a sputtering target having different ZnO and Zn/Sn ratios), or by RF sputtering method using a single IZTO sputtering target having the same composition as that of the desired oxide. Also, a ZTO film (conventional example) was formed by co-sputtering method in which electric discharge is simultaneously applied to an oxide target (Zn—Sn—O) having a ratio of Zn:Sn of 6:4 (atomic percent ratio) and an oxide target of ZnO.

The contents of the respective metal elements in the oxide thin films obtained in this manner were analyzed by XPS (X-ray Photoelectron Spectroscopy) method.

After the thin oxide films were thus formed as above, patterning was performed by photolithography and wet etching. The etchant used was "ITO-07N" manufactured by Kanto Chemical Co., Inc. In this example, the wet etchability of the thin oxide films used in the experiment was evaluated by optical microscopic observation. The evaluation results show that residue did not occur due to wet etching for all the compositions used in the experiment, and all the thin oxide films were appropriately etched.

After the patterning, pre-annealing treatment was performed on the oxide semiconductor films to improve the film quality thereof. The pre-annealing was performed at 350° C. under atmospheric pressure for 1 hour.

Next, a source-drain electrode was formed by a lift-off method using pure Ti. Specifically, after patterning was carried out using a photoresist, a Ti thin film was formed by a DC sputtering method (film thickness 100 nm). A method for forming the Ti thin film for a source-drain electrode is the same as that in the case of the gate electrode described above. Next, an unnecessary photoresist was removed by dipping in acetone with an ultrasonic washing apparatus to give TFT with a channel length of 10 μm and a channel width of 200 μm.

After the source-drain electrode was formed as described, a passivation layer was formed to protect each oxide semiconductor layer. As the passivation layer, a layered film (total film thickness 400 nm) of $SiO_2$ (film thickness 200 nm) and SiN (film thickness 200 nm) was used. The above-mentioned $SiO_2$ and SiN were formed by a plasma CVD method using "PD-220NL" manufactured by SAMCO Inc. In this example, after plasma treatment was carried out by $N_2O$ gas, the $SiO_2$ film and the SiN film were successively formed. A mixed gas of $N_2O$ and $N_2$ diluted $SiH_4$ was used for the formation of the $SiO_2$ film and a mixed gas of $N_2$ diluted $SiH_4$, $N_2$ and $NH_3$ was used for the formation of the SiN film. In both cases, the film formation power was set to 100 W and the film formation temperature was set to 150° C.

Next, a contact hole for probing for evaluating transistor characteristics was formed in the passivation layer by photolithography and dry etching. Next, an ITO film (film thickness 80 nm) was formed using a DC sputtering method in conditions as follows: carrier gas: mixed gas of argon gas and oxygen gas, film formation power: 200 W, and gas pressure: 5 mTorr, to produce a TFT shown in FIG. 1.

Each TFT obtained as described above was subjected to investigations as follows.

(1) Measurement of Transistor Characteristics

The transistor characteristics (drain current-gate voltage characteristics, Id-Vg characteristics) were measured using a semiconductor parameter analyzer ("4156C" manufactured by Agilent Technologies). The detailed measurement conditions were as follows. In this example, the ON-current (Ion) at Vg=20 V was read, and the pass criterion was that Ion ≥1×10$^{-5}$ A.
 Source voltage: 0V
 Drain voltage: 10V
 Gate voltage: −30 to 30V (measurement interval: 0.25V)

(2) Threshold Voltage (Vth)

The threshold voltage is roughly a value of gate voltage at the time when a transistor is shifted from OFF state (state where drain current is low) to ON state (state where drain current is high). In this example, the voltage in the case where the drain current is over 1 nA between ON-current and OFF-current is defined as the threshold voltage, and the threshold voltage of each TFT was measured. In this example, the pass criterion was that Vth (absolute value) is 5V or less.

(3) S Value

The S value (SS value) was defined as the minimum value of the gate voltage necessary for increasing the drain current by one digit. In this example, the pass criterion was that S value is 1 V/dec or less.

(4) Carrier Mobility (Electron Field-Effect Mobility)

The carrier mobility (electron field-effect mobility) was calculated as the mobility in a saturation region according to the following expression. In this example, the pass criterion was that the saturation mobility of 5 cm²/Vs or higher.

$$I_d = \frac{1}{2}\mu_{FE}C_{OX}\frac{W}{L}(V_{gs} - V_{th})^2 \quad [\text{Math 1}]$$

Cox: insulator layer capacitance
W: channel width
L: channel length
Vth: threshold voltage (5) Evaluation of Stress Stability (Light Irradiation and Negative Bias Application as Stress)

In this example, stress tests were carried out by irradiation of light while applying negative bias to a gate electrode for simulation of environments (stress) at the time of actual panel drive. The stress tests conditions were as follows. A light wavelength with about 400 nm was selected which was close to the band gap of an oxide semiconductor and with which the transistor characteristics tend to be easily fluctuated.

Gate voltage: −20V
Substrate temperature: 60° C.
Light stress
Wavelength: 400 nm
Illuminance (light intensity for irradiation to TFT): 0.1 μW/cm²
Light source: LED manufactured by OptoSupply Limited (light quantity was adjusted by an ND filter)
Stress tests time: 3 hour Specifically, the threshold voltages (Vth) before and after the stress tests were measured using the technique described above, and a difference therebetween (ΔVth) was determined. In this example, the pass criterion was that the threshold voltage shift (the absolute value of ΔVth) is 15 V or less.

These results are shown in Table 1.

Figure 3:
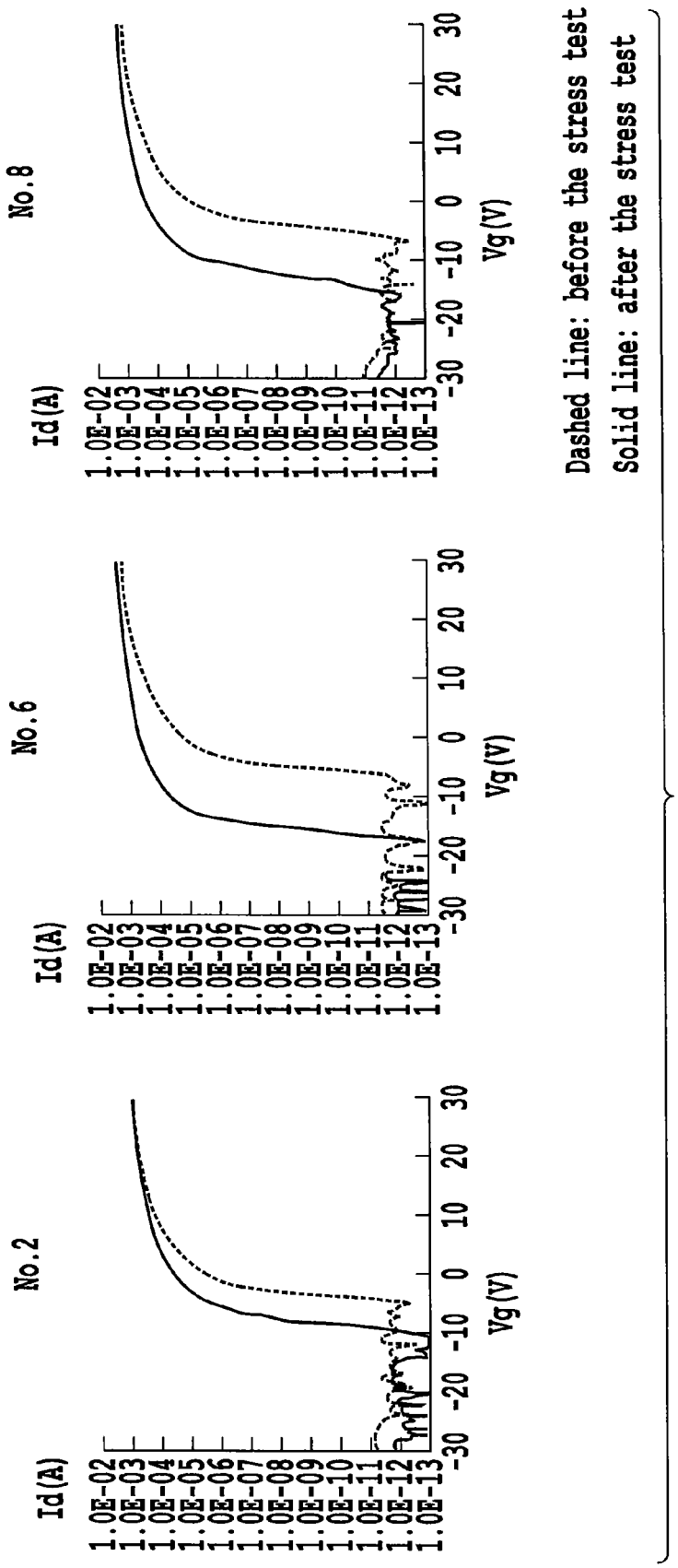
FIG. 3 is a view showing TFT characteristics before and after stress tests in the case of a portion data of the Examples.

Also, for a portion of the examples, the resulting drain current-gate voltage characteristics (Id-Vg characteristics) before and after the stress tests are shown in FIG. 3 (all of Nos. 2, 6, and 8 in Table 1 are examples of the present invention). In these figures, the results before the stress tests are indicated by a dashed line, and the results after the stress tests (after three hours from the application) are indicated by a solid line.

Nos. 1 to 8, 11, and 12 in Table 1 satisfy all expressions (1) to (3) defined in the present invention, and therefore, had excellent TFT characteristics including mobility, and had ΔVth which was reduced to a predetermined range, and therefore, had excellent stress stability.

FIG. 3 shows graphs indicating changes in the TFT characteristics before and after the stress tests of Nos. 2, 6, and 8. In all cases, the requirements of the present invention were satisfied, and therefore, the stress stability was satisfactory, and satisfactory switching characteristics were obtained even after the stress tests.

In contrast to this, Nos. 9 and 10 in Table 1 are examples in which the In ratio represented by expression (3) does not satisfy the requirements of the present invention, and in which ΔVth increased and therefore the stress stability significantly decreased. Furthermore, No. 10 in Table 1 has a larger In ratio than that of No. 9, and therefore, Vth also increased in the absence of light irradiation.

Also, No. 13 in Table 1 is an example which does not satisfy expressions (1) and (3), resulting in an increase in the Sn ratio, and in which the Vth value increased and the TFT characteristics decreased. The present invention is intended to simultaneously obtain both satisfactory TFT characteristics and satisfactory stress stability. TFTs having unsatisfactory TFT characteristics are not suitable for use even if their stress stability is satisfactory. Therefore, for above example, the stress stability test was not conducted ("-" is shown in the ΔVth (V) column in Table 1, and the same applies to other examples below).

Also, No. 14 in Table 1 is an example which does not satisfy expression (2) and has a large Zn ratio, and in which the mobility sharply decreased and the Vth value significantly increased. Therefore, the stress stability test was not conducted.

The above experiment results show that the use of the IZTO semiconductor having the composition ratio defined by the present invention can provide higher stress stability and satisfactory TFT characteristics while maintaining the mobility as high as that of conventional ZTO. Also, the semiconductor was satisfactorily processed by wet etching. Therefore, it is inferred that the oxide of the present invention may have an amorphous structure.

| | | | | Expression (1) | | Expression (2) | | Expression (3) | | | absence of light irradiation | | | ΔVth |
|---|---|---|---|---|---|---|---|---|---|---|---|---|---|---|
| | ratio to [In] + [Zn] + [Sn] | | | Value on the right side | determination | Value on the right side | determination | Value on the right side | determination | saturation mobility | Ion (A) | S(V/dec) | Vth (V) | (V) |
| No. | [In] | [Zn] | [Sn] | | | | | | | | | | | |
| 1 | 0.02 | 0.40 | 0.40 | 0.10 | ○ | −0.87 | ○ | 0.23 | ○ | 14 | 0.003 | 0.4 | −2 | −12 |
| 2 | 0.10 | 0.54 | 0.36 | 0.04 | ○ | −0.64 | ○ | 0.34 | ○ | 11 | 0.003 | 0.4 | −2 | −8 |
| 3 | 0.20 | 0.53 | 0.27 | 0.01 | ○ | −0.50 | ○ | 0.41 | ○ | 13 | 0.003 | 0.4 | −2 | −7 |
| 4 | 0.20 | 0.64 | 0.16 | −0.06 | ○ | −0.19 | ○ | 0.56 | ○ | 11 | 0.003 | 0.4 | −2 | −6 |
| 5 | 0.10 | 0.45 | 0.45 | 0.10 | ○ | −0.87 | ○ | 0.23 | ○ | 13 | 0.003 | 0.4 | −1 | −9 |
| 6 | 0.30 | 0.42 | 0.28 | 0.04 | ○ | −0.64 | ○ | 0.34 | ○ | 15 | 0.004 | 0.3 | −3 | −13 |
| 7 | 0.15 | 0.60 | 0.25 | −0.01 | ○ | −0.40 | ○ | 0.46 | ○ | 11 | 0.003 | 0.4 | −1 | −5 |
| 8 | 0.30 | 0.53 | 0.18 | −0.04 | ○ | −0.20 | ○ | 0.51 | ○ | 15 | 0.004 | 0.3 | −3 | −11 |
| 9 | 0.50 | 0.25 | 0.25 | 0.10 | ○ | −0.87 | ○ | 0.23 | x | 15 | 0.004 | 0.3 | −4 | −17 |
| 10 | 0.60 | 0.24 | 0.16 | 0.04 | ○ | −0.64 | ○ | 0.24 | x | 19 | 0.004 | 0.3 | −7 | −18 |
| 11 | 0.25 | 0.53 | 0.23 | −0.01 | ○ | −0.41 | ○ | 0.45 | ○ | 13 | 0.003 | 0.4 | −1 | −10 |
| 12 | 0.15 | 0.64 | 0.21 | −0.04 | ○ | −0.30 | ○ | 0.51 | ○ | 10 | 0.003 | 0.4 | −1 | −9 |
| 13 | 0.15 | 0.30 | 0.55 | 0.17 | x | −1.21 | ○ | 0.07 | x | 18 | 0.005 | 0.9 | −12 | — |
| 14 | 0.10 | 0.85 | 0.05 | −0.14 | ○ | 0.14 | x | 0.72 | ○ | 4 | 0.0006 | 0.7 | −7 | — |

\* In the column for expression (1), "value" indicates the value on the right side of expression (1) and "determination" indicates that "○" is used when the relationship represented by expression (1) is satisfied and "x" is used when it is unsatisfied.
\* In the column for expression (2), "value" indicates the value on the right side of expression (2) and "determination" indicates that "○" is used when the relationship represented by expression (2) is satisfied and "x" is used when it is unsatisfied.
\* In the column for expression (3), "value" indicates the value on the right side of expression (3) and "determination" indicates that "○" is used when the relationship represented by expression (3) is satisfied and "x" is used when it is unsatisfied.

Example 2

In this example, the densities of oxide films (film thickness 100 nm) formed by using an oxide with the composition corresponding to Nos. 3, 6, and 11 in Table 1 and controlling the gas pressure at the time of sputtering film formation to 1 mTorr, 3 mTorr, or 5 mTorr were measured, and the mobility and the change quantity ($\Delta$Vth) of threshold voltage after the stress test (light irradiation+negative bias application) were investigated for a TFT produced in the same manner as in Example 1 described above. A method for measuring the film density is as follows.

(Measurement of Density of Oxide Film)

The density of the oxide film was measured by XRR (X-ray reflectivity method). The detailed measurement conditions were as follows.

Analysis apparatus: Horizontal type x-ray diffraction apparatus Smart Lab manufactured by Rigaku Co., Ltd.
Target: Cu (beam source: K$\alpha$ ray)
Target output power: 45 kV-200 mA
Production of measurement sample A sample used was produced by forming a film (film thickness 100 nm) of an oxide with each composition on a glass substrate in the following sputtering conditions, and thereafter carrying out the same heat treatment as that for pre-annealing treatment simulating the pre-annealing treatment in the TFT production process of Example 1 as described above.

Sputtering gas pressure: 1 mTorr, 3 mTorr, or 5 mTorr
Oxygen partial pressure: $O_2/(Ar+O_2)=2\%$
Film formation power density: DC 2.55 W/cm$^2$
Heat treatment: 350° C. for 1 hour under an air atmosphere These results are shown in Table 2. In Table 2, the values of expressions (4) and (5) and the determination results are additionally shown for the purpose of reference. For example, in the column for expression (4) in Table 2, "value" indicates the value on the right side of expression (4), and "determination" indicates that "circles" is used when the relationship represented by expression (4) is satisfied and "crosses" is used when it is unsatisfied. The same applies to expression (5).

a gas pressure of 5 mTorr (No. 3) was 5.8 g/cm$^3$, whereas the film density at the time of a gas pressure of 3 mTorr (No. 2) was 6.0 g/cm$^3$ and the film density at the time of a gas pressure of 1 mTorr (No. 1) was 6.2 g/cm$^3$, and as the gas pressure was lowered, a higher density was obtained. Also, as the film density was increased, the mobility was improved and the shift quantity of threshold value (the absolute value of $\Delta$Vth) by the stress test was also lowered.

According to the experimental results, it was found that the density of the oxide film was changed in accordance with the gas pressure at the time of sputtering film formation, and if the gas pressure was lowered, the film density was increased and accordingly, the electron field-effect mobility was increased significantly and the shift quantity of threshold voltage (the absolute value of $\Delta$Vth) in the stress test (light irradiation+ negative bias stress) was decreased. That is supposedly attributed to that the disturbance of sputtered atoms (molecules) can be suppressed by lowering the gas pressure at the time of sputtering film formation to lessen the defects in the film, and thus the mobility and the electric conductivity are increased to improve the TFT stability.

Although Table 2 shows the results which were obtained when the oxides of Nos. 3, 6, and 11 of Table 1 were used, the above-described relationship between the density of the oxide film and the mobility of TFT characteristics or the amount of a threshold voltage change after the stress test was similarly observed for other oxides satisfying the requirements of the present invention (e.g., Nos. 1, 2, 4, 5, 7, 8, and 12 in Table 1).

EXPLANATION OF REFERENCE NUMERALS

1 Substrate
2 Gate electrode
3 Gate insulator layer
4 Oxide semiconductor layer
5 Source-drain electrode
6 Passivation layer (insulator layer)
7 Contact hole
8 Transparent conductive film

TABLE 2

| No. | Composition | Gas pressure at the time of film formation (mTorr) | Density (g/cm$^3$) | Movility (cm$^2$/Vs) | $\Delta$Vth (V) | $\Delta$Vth determination | In ratio | Expression (3) Value on the right side | Expression (3) determination | Expression (4) Value on the right side | Expression (4) determination | Expression (5) Value on the right side | Expression (5) determination |
|---|---|---|---|---|---|---|---|---|---|---|---|---|---|
| 1 | Same as No.3 in Table 1 In0.20, Zn0.53, Sn0.27 | 1 | 6.2 | 16.6 | −1.3 | ☆ | 0.20 | 0.40 | ○ | 0.20 | ○ | 0.04 | x |
| 2 | | 3 | 6.0 | 14.5 | −4.2 | ☆ | 0.20 | 0.40 | ○ | 0.20 | ○ | 0.04 | x |
| 3 | | 5 | 5.8 | 12.7 | −7.4 | ◎ | 0.20 | 0.40 | ○ | 0.20 | ○ | 0.04 | x |
| 4 | Same as No.6 in Table 1 In0.30, Zn0.42, Sn0.28 | 1 | 6.2 | 18.2 | −6.0 | ☆ | 0.30 | 0.34 | ○ | 0.14 | x | −0.02 | x |
| 5 | | 3 | 5.9 | 16.7 | −10.7 | ○ | 0.30 | 0.34 | ○ | 0.14 | x | −0.02 | x |
| 6 | | 5 | 5.8 | 15.2 | −13.4 | ○ | 0.30 | 0.34 | ○ | 0.14 | x | −0.02 | x |
| 7 | Same as No.11 in Table 1 In0.25, Zn0.53, Sn0.23 | 1 | 6.2 | 17.4 | −4.2 | ☆ | 0.25 | 0.45 | ○ | 0.25 | ○ | 0.09 | x |
| 8 | | 3 | 5.9 | 15.6 | −6.9 | ◎ | 0.25 | 0.45 | ○ | 0.25 | ○ | 0.09 | x |
| 9 | | 5 | 5.8 | 13.3 | −10.3 | ○ | 0.25 | 0.45 | ○ | 0.25 | ○ | 0.09 | x |

Nos. 3, 6, and 9 in Table 1 are the same as 3, 6, and 11 in Table 1 as mentioned above, respectively.

According to Table 2, the oxides in Table 2 satisfying all requirement defined by the present invention all showed a high density of 5.8 g/cm$^3$ or higher. Examining the case using No. 3 in Table 1 as for example, the film density at the time of

The invention claimed is:
1. An oxide, comprising
Zn, Sn, and In,
wherein
a content of Zn, Sn, and In in the oxide is defined in atomic % as [Zn], [Sn], and [In], respectively;

the content satisfies expressions (1) to (3):

$$[In]/([In]+[Zn]+[Sn]) \geq -0.53 \times [Zn]/([Zn]+[Sn])+0.36 \quad (1),$$

$$[In]/([In]+[Zn]+[Sn]) \geq 2.28 \times [Zn]/([Zn]+[Sn])-2.01 \quad (2),$$

$$[In]/([In]+[Zn]+[Sn]) \leq 1.1 \times [Zn]/([Zn]+[Sn])-0.32 \quad (3);$$

$[In]/([In]+[Zn]+[Sn])$ is 0.1 or higher;
$[Sn]/([In]+[Zn]+[Sn])$ is 0.16 or higher; and
the oxide has a density of 5.8 g/cm$^3$ or higher.

2. A thin-film transistor comprising a semiconductor layer comprising the oxide of claim 1.

3. A sputtering target, comprising
Zn, Sn, and In,
wherein
content of Zn, Sn, and In contained in the sputtering target is defined in atomic % as [Zn], [Sn], and [In], respectively;
the content satisfies expressions (1) to (3):

$$[In]/([In]+[Zn]+[Sn]) \geq -0.53 \times [Zn]/([Zn]+[Sn])+0.36 \quad (1),$$

$$[In]/([In]+[Zn]+[Sn]) \geq 2.28 \times [Zn]/([Zn]+[Sn])-2.01 \quad (2),$$

$$[In]/([In]+[Zn]+[Sn]) \leq 1.1 \times [Zn]/([Zn]+[Sn])-0.32 \quad (3);$$

$[In]/([In]+[Zn]+[Sn])$ is 0.1 or higher;
$[Sn]/([In]+[Zn]+[Sn])$ is 0.16 or higher; and
the sputtering target has a density of 5.8 g/cm$^3$ or higher.

* * * * *